United States Patent [19]

Elabd

[11] Patent Number: 4,870,293

[45] Date of Patent: Sep. 26, 1989

[54] EXTENDED-WIDTH CCD IMAGER ARRAY CAPABLE OF TIME-DELAY-INTEGRATION OPERATION

[75] Inventor: Hammam Elabd, Sunnyvale, Calif.

[73] Assignee: General Electric Company, Schenectady, N.Y.

[21] Appl. No.: 196,699

[22] Filed: May 20, 1988

[51] Int. Cl.$^4$ .................. H01J 40/14; H01L 29/78; H01L 27/14; H01L 31/00

[52] U.S. Cl. .................. 250/578; 357/24; 357/30; 377/60; 358/213.25

[58] Field of Search ............... 357/24, 30; 377/57–63; 250/578; 358/213.11, 213.25, 213.26, 213.29

[56] References Cited

U.S. PATENT DOCUMENTS

| | | | |
|---|---|---|---|
| 4,654,681 | 3/1987 | Jastrzebski | 357/24 LR |
| 4,663,656 | 5/1987 | Elabd et al. | 358/213.26 |
| 4,758,895 | 7/1988 | Elabd | 358/213.26 |
| 4,803,710 | 2/1989 | Elabd | 377/60 |

OTHER PUBLICATIONS

Ibrahim et al., "A High Resolution Buttable Time Delay and Integrate Imaging CCD", 1978 Int. Conf. Application of Charge Coupled Devices, San Diego, Oct. 1978, Proc., pp. 1-25 to 1-40.

Primary Examiner—Gene M. Munson
Attorney, Agent, or Firm—Henry I. Steckler; James C. Davis, Jr.; Paul R. Webb, II

[57] ABSTRACT

A plurality of CCD imagers have their respective image registers arranged in side-by-side alignment respectively to receive contiguous portions of an image. The CCD imagers have respective field storage registers disposed on both sides of the arrayed image registers. The CCD imagers are operated with the direction of TDI operation relative to the positioning of the imager chosen such that a combined TDI operation in one direction is obtained for the plurality of CCD imagers.

10 Claims, 16 Drawing Sheets

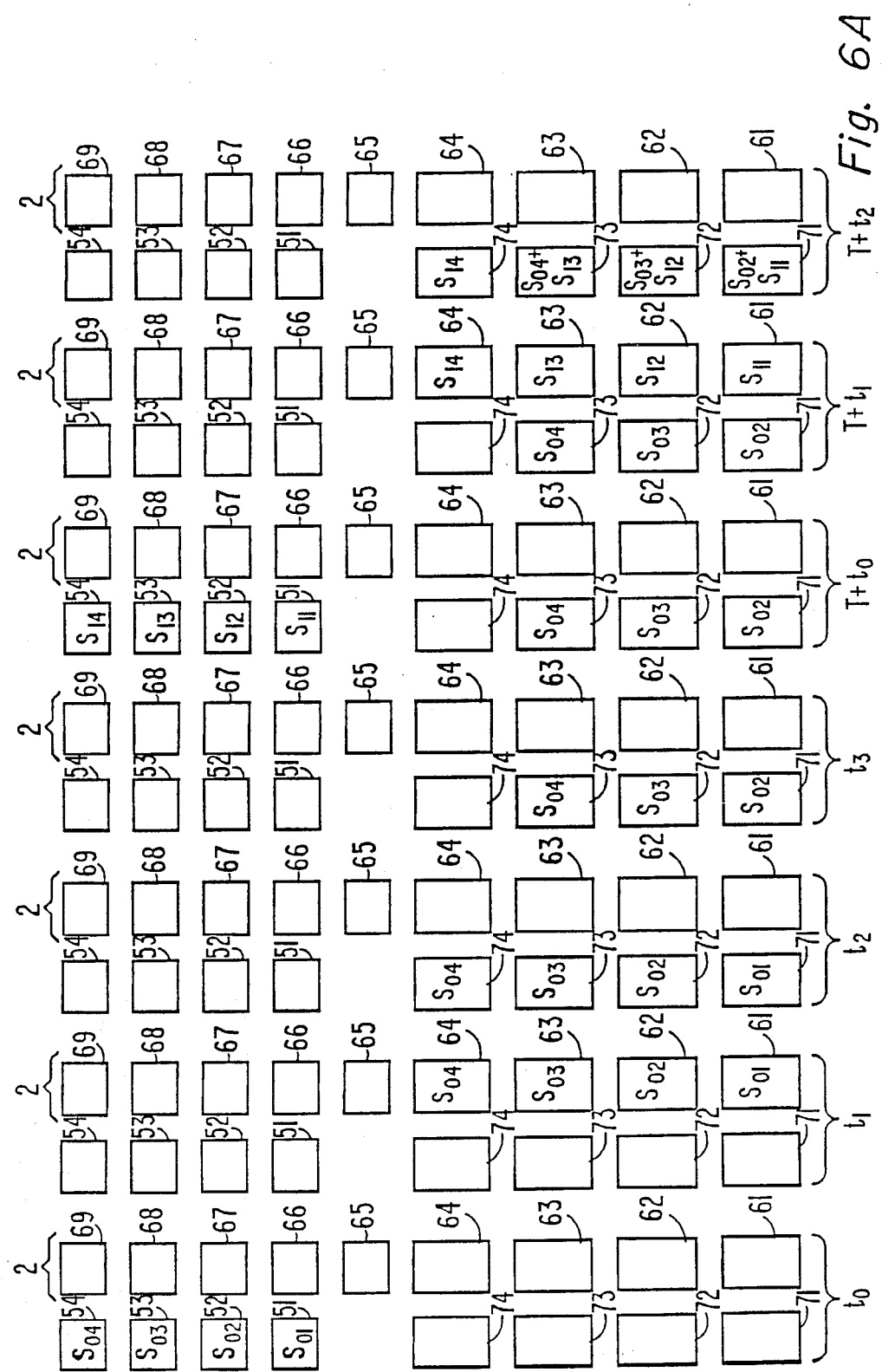

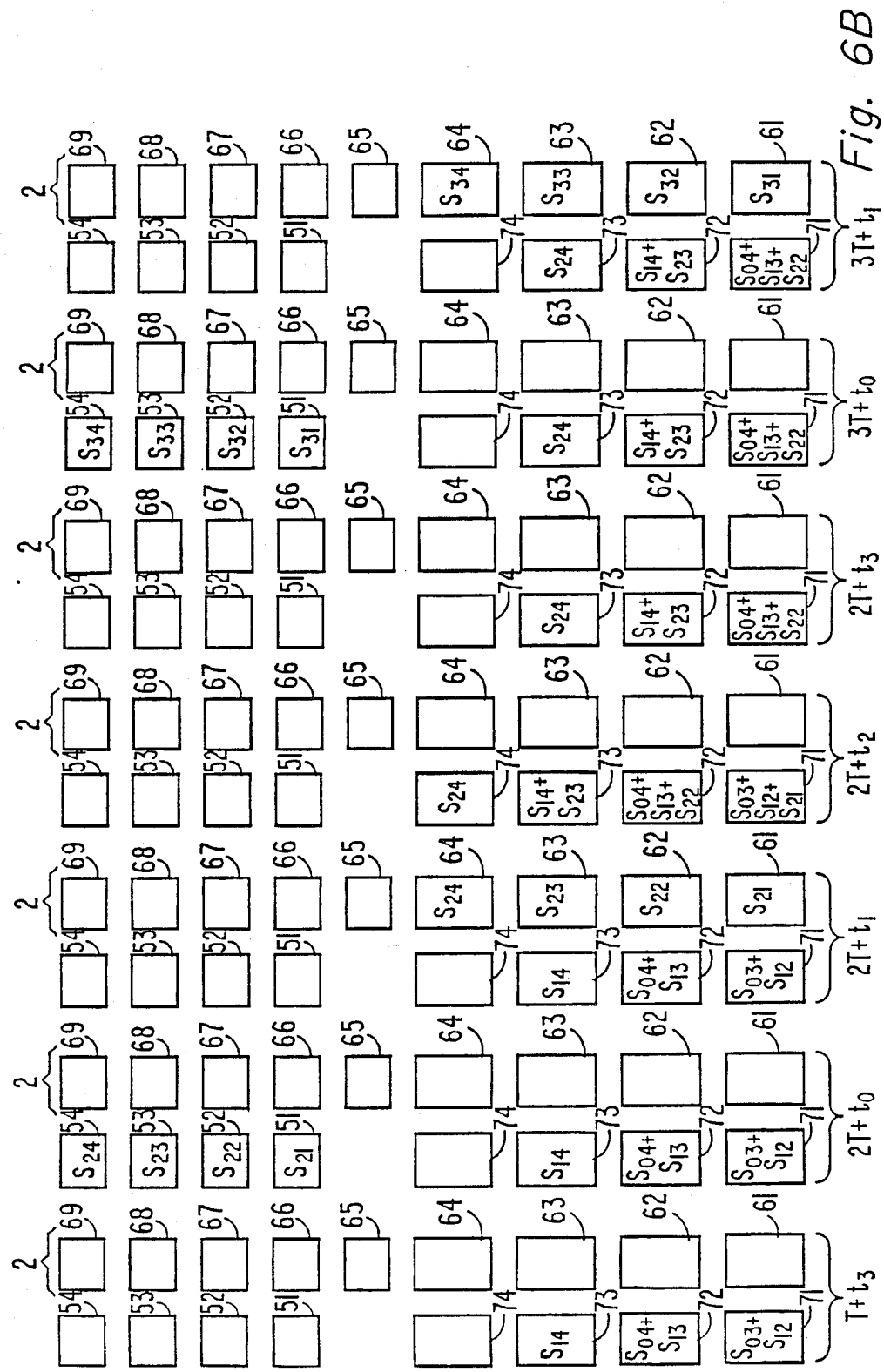

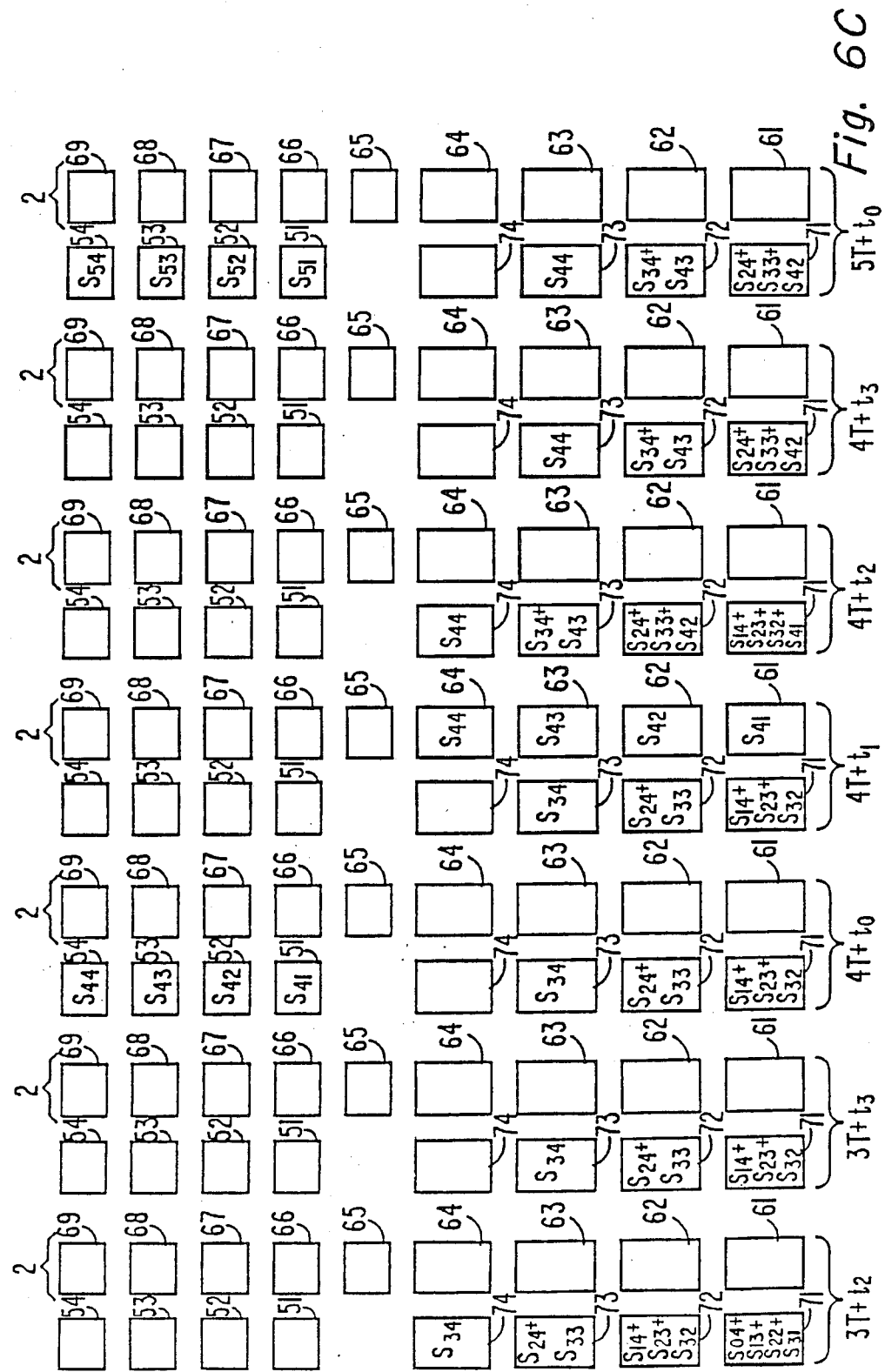

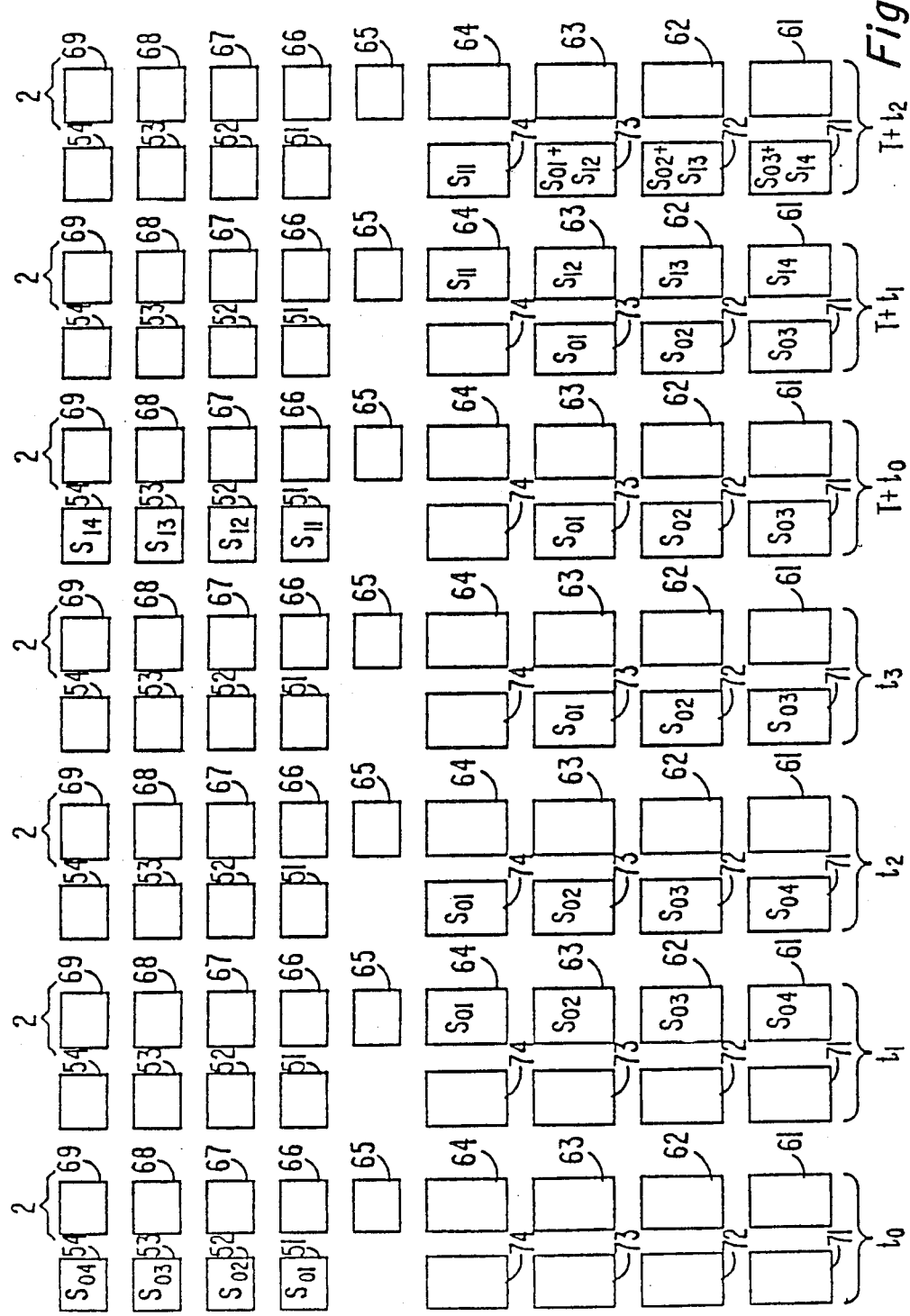

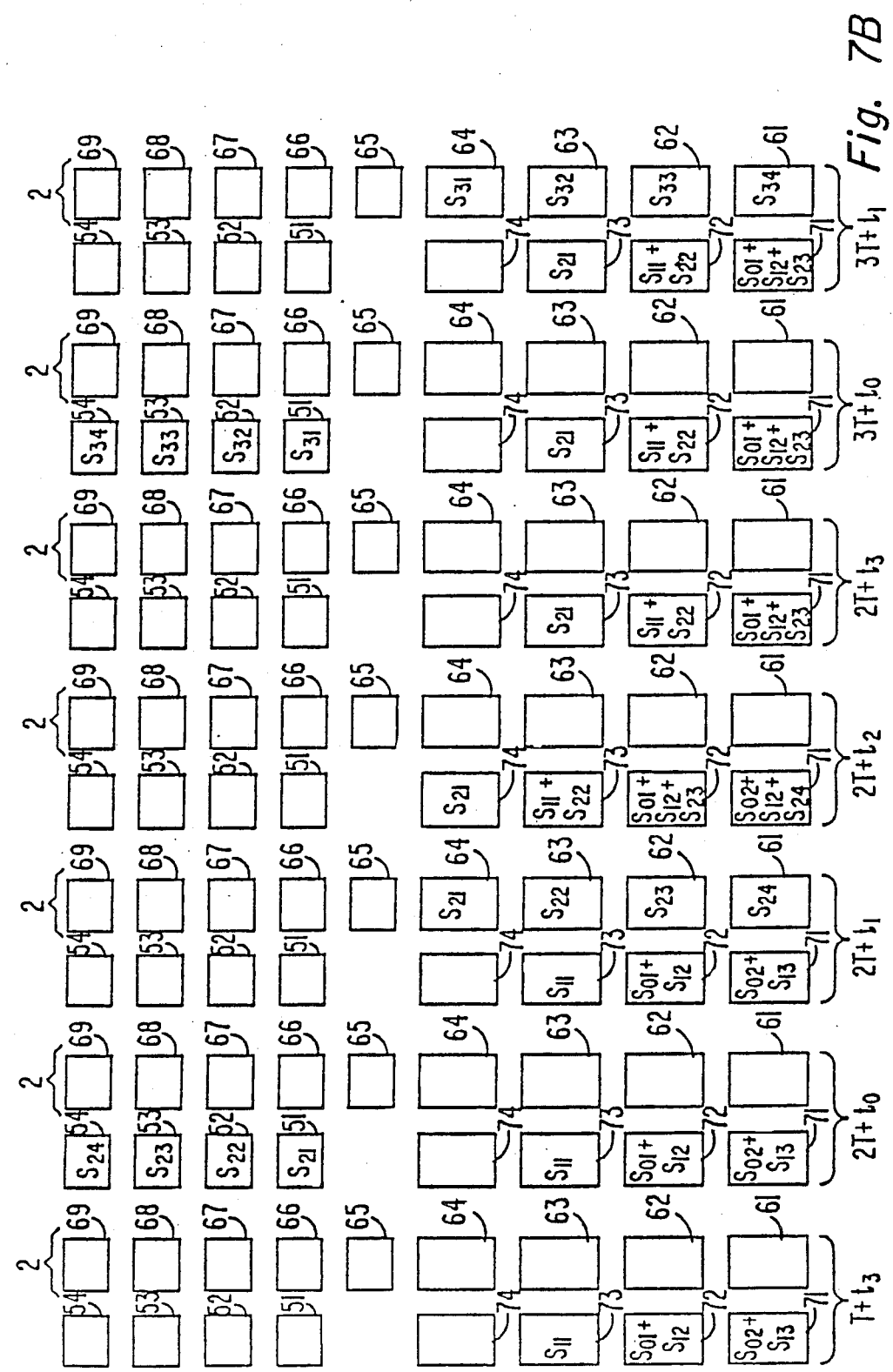

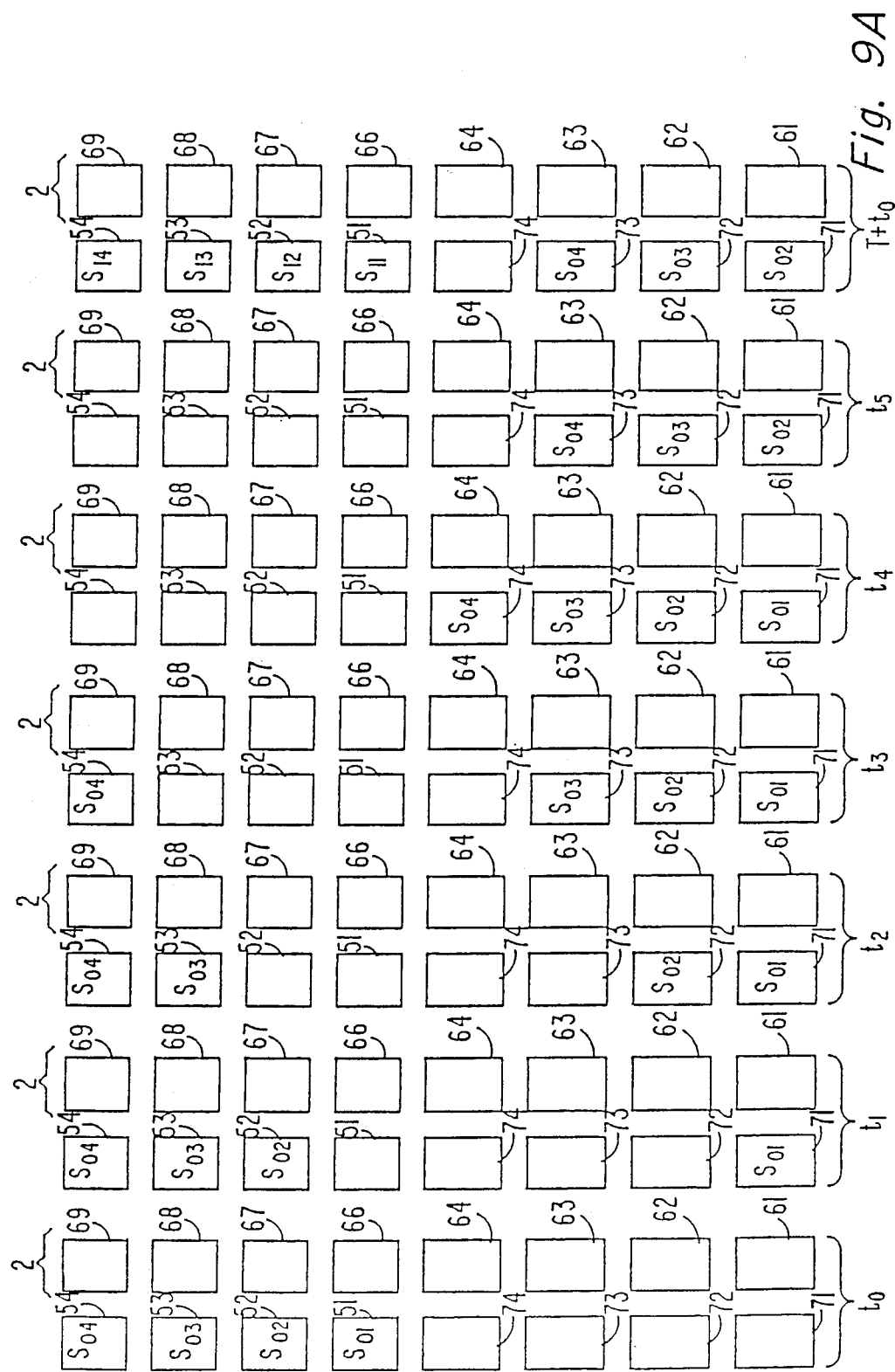

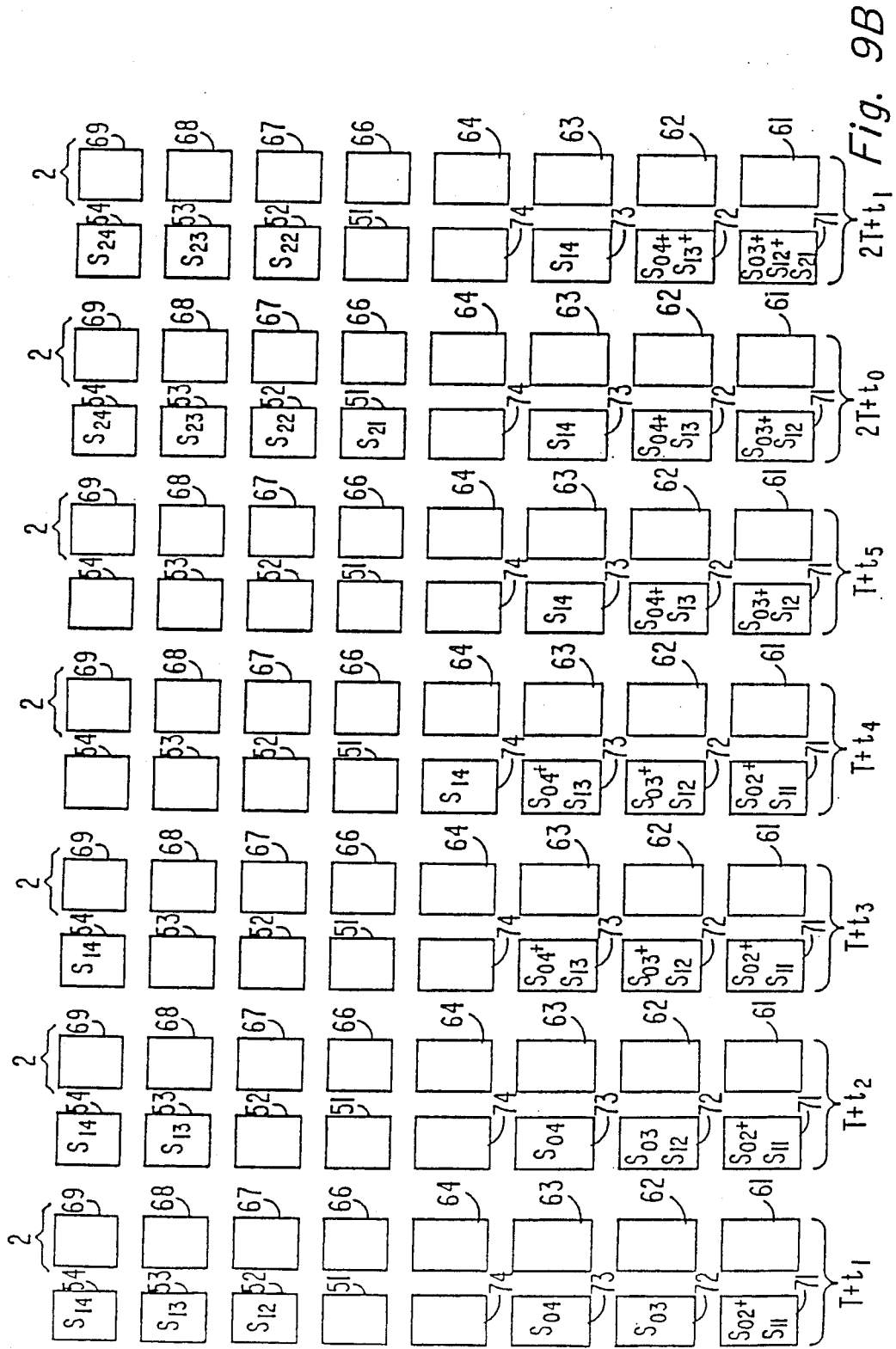

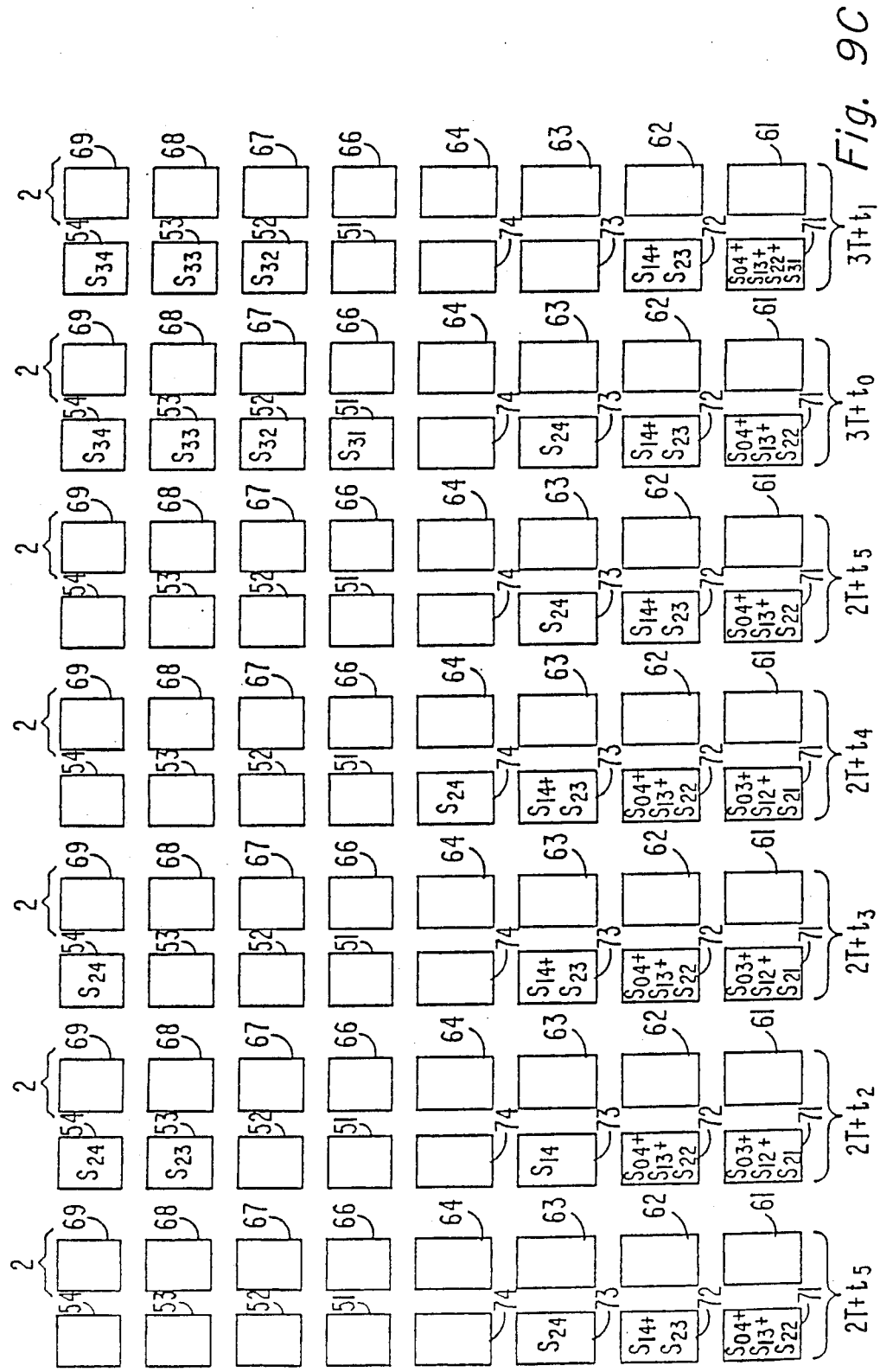

EXTENDED-WIDTH CCD IMAGER ARRAY CAPABLE OF TIME-DELAY-INTEGRATION OPERATION

The present invention relates to solid-state imager arrays and, more particularly, to obtaining time-delay-integration (TDI) operation from such imager arrays.

BACKGROUND OF THE INVENTION

H. Elabd and W. F. Kosonocky in their U.S. Pat. No. 4,663,656 issued May 5, 1987, entitled "HIGH-RESOLUTION CCD IMAGERS USING AREA-ARRAY CCD'S FOR SENSING SPECTRAL COMPONENTS OF AN OPTICAL LINE IMAGE", assigned to RCA Corporation, and incorporated herein by reference describe an area-imager architecture suitable for connection in array as an extended width imager. FIG. 2 of the drawing of the Elabd et alii patent shows two side-by-side $A_1$ and $A_2$ image registers having respective rows for sensing red, green, blue and infrared spectral components of a line image. The side by side $A_1$ and $A_2$ image registers together extend across the entire width of the monolithic semiconductor die on which the extended-width imager is constructed. The $A_1$ and $A_2$ image registers periodically transfer charge packets to respective $B_1$ and $B_2$ field storage registers disposed on opposite sides of their respective image registers. This allows parallel-to-serial-converting $C_1$ and $C_2$ line registers, at the opposite ends of these $B_1$ and $B_2$ filed storage registers from their respective $A_1$ and $A_2$ image registers, to clock out streams of charge packets to respective $E_1$ and $E_2$ electrometer stages that are located at the ends of the $C_1$ and $C_2$ line registers opposite the die edges.

It is desirable to be able to increase the sensitivity of an extended-width CCD area imager by using a time-delay-integration (TDI) mode of operation. This cannot be done with conventional TDI imagers because only one direction of TDI operation is available.

H. Elabd in his U.S. patent application Ser. No. 938,863 filed Dec. 8, 1986, entitled "STORAGE REGISTERS WITH CHARGE PACKET ACCUMULATION CAPABILITY, AS FOR SOLID STATE IMAGERS", assigned to RCA Corporation, and incorporated herein by reference describes ways to achieve TDI operation for either of two opposing directions of motion using substantially the same imager structure. (This application, which is allowed and has had its issue fee paid, is a continuation-in-part of U.S. patent application Ser. No. 797,236 filed Nov. 12, 1985). These ways of achieving TDI operation involve field storage registers being of a special construction allowing the shuffling of the order of lines of charge packets in the rows of the registers.

SUMMARY OF THE INVENTION

The invention is to use imager configurations that can provide either of two opposed directions of TDI operation (e.g., as described hereinafter or in application Ser. No. 938,863) arranged analogously to imager configurations in U.S. Pat. No. 4,663,656. The component imagers with field storage registers "above" the side-by-side image registers are operated to provide one direction of TDI operation with respect to the direction of charge transfer from image register to field storage register, and the component imagers with field storage registers "below" the side-by-side image registers are operated so as to provide the opposite direction of TDI operation with respect to the direction of charge transfer from image register to field storage register. This arrangement generates charge packet ensembles from the several component imagers which exhibit TDI operation in the same direction despite their different orientations.

BRIEF DESCRIPTION OF THE DRAWING

FIGS. 6A-C are a set of timing diagrams for an imager of the type shown in FIG. 1, illustrating a method of carrying out time-delay-integration in the CCD storage register.

FIGS. 7A-C are a set of timing diagrams for an imager of the type shown in FIG. 1, illustrating another method of carrying out time-delay-integration in the CCD storage register. This method accommodates relative image motion in the direction opposite to that direction of relative image motion accommodated by the method illustrated in FIGS. 6A-C.

FIGS. 9A-D are a set of timing diagrams for an imager of the type shown in FIG. 8, illustrating a method for carrying out time-delay-integration in the CCD storage register.

DETAILED DESCRIPTION

Figure 1:
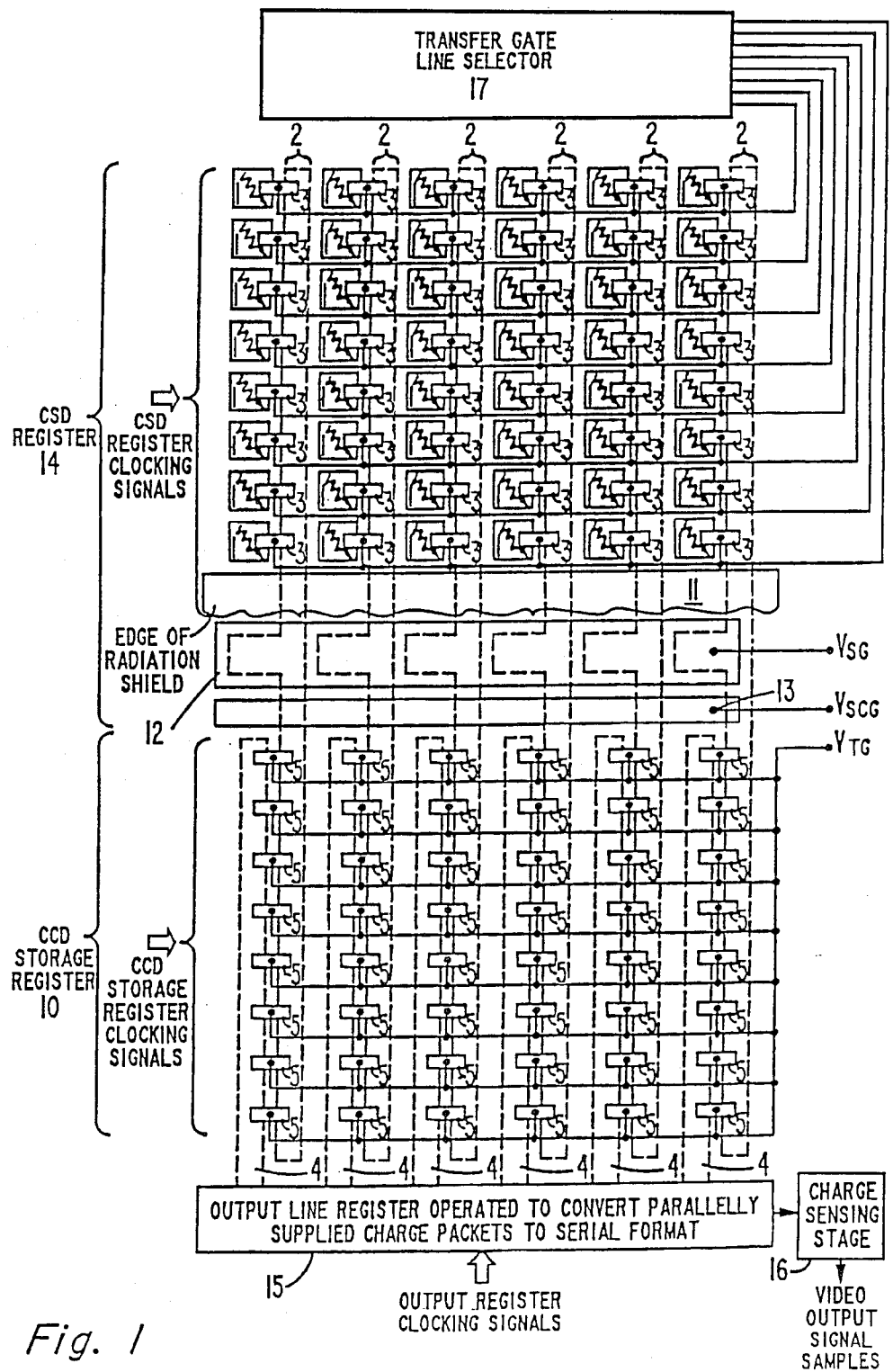
FIG. 1 is a block schematic diagram of a infrared line imager that can be used in the present invention and that is described in U.S. patent application Ser. No. 022,587 filed by H. Elabd on Mar. 4, 1987 as a continuation of U.S. patent application Ser. No. 817,536 filed Jan. 9, 1986, now abandoned, both of which applications are entitled "STORAGE REGISTERS WITH CHARGE PACKET ACCUMULATION CAPABILITY, AS FOR SOLID-STATE IMAGERS" and are assigned to RCA Corporation. The imager uses a CSD image register with Schottky-barrier diode photosensors, and it uses a CCD storage register with time-delay-integration capability between its image register and output CCD shift register.

In FIG. 1 a charge-sweep-device solid-state imager is modified to include a CCD storage register 10 in which time-delay-integration is performed. CCD storage register 10 is recurrently parallelly loaded with respective lines of charge packets. Each line of charge packets is clocked forward from charge storage wells induced in buried CCD charge transfer channels 2 under a storage gate electrode 12. During this clocking forward, the voltage $V_{SG}$ applied to electrode 12 is pulsed negatively from its normal relatively positive value to reduce the depth of the charge storage wells, and the voltage $V_{SCG}$ applied to a succeeding storage control gate electrode 13 is pulsed positively from its normal relatively negative value to lower the charge transfer barrier normally induced under electrode 13. (Storage gate electrode 12 and storage gate electrode 13, then, implement one possible form of an intermediate storage register, a line storage register in this instance.)

CCD storage register 10 recurrently side-loads the successive charge transfer stages of a CCD output line register 15 with respective charge packets. Each line of charge packets loaded from CCD storage register 10 is a time-delay-integration response to a plurality of the lines of charge packets previously clocked forward into register 10. After being parallelly loaded with a line of charge packets, the output line register 15 is operated as a CCD shift register to transfer the charge packets serially to a charge sensing stage 16 for conversion to respective samples of video output signal.

The CCD storage register 10 and CCD output line register 15 are usually covered by a radiation shield 11, a cutaway portion of which is shown in FIG. 1. This radiation shield 11 also extends over the storage and storage-control gate electrodes 12, 13 of CSD register 14. If the radiation to which the FIG. 1 imager is exposed is long enough in wavelength to be beyond the band of wavelengths to which silicon is photosensitive, radiation shield 11 need not be provided.

In the charge-sweep-device register 14 of the FIG. 1 imager, preceding CCD storage register 10, photosensors 1 are arrayed by row and by column. The photosensors 1 will be considered to be Schottky barrier diode infrared sensors in certain preferred embodiments of the invention, but may instead be another type of photosensor. Photosensors 1 may be visible-light responsive, infrared responsive, or both. (Each box representative of one of the photosensors 1 includes a wavy arrow representative of impinging radiation as well as the identification numeral 1 in its lower left corner.) A respective one of the buried CCD charge transfer channels 2, shown in dashed outline, parallels each column of photosensors 1 and comprises a succession of charge transfer stages corresponding to respective ones of the photosensors in the column the charge transfer channel 2 parallels. A respective transfer gate electrode 3 provides for selective connection of each photosensor 1 and its corresponding charge transfer stage in column CCD charge transfer channel 2. These selective connections may be surface-channel or buried-channel. The transfer gate electrodes 3 in each row connect in common to a respective bus to which a line selection signal is selectively applied by a transfer gate line selector 17.

Gate electrodes cross CCD charge transfer channels 2 and are receptive of CSD register clocking signals to cause the transfer of charge packets down the channels. Such conventional gate electrodes are not specifically shown in FIG. 1, to avoid cluttering the drawing. These gate electrodes cross the array of charge transfer channels from left to right, generally speaking, with different gate electrodes in each pitch sequence normally being made into a respective polysilicon layer, separated from the other polysilicon layers and the substrate surface by electrically insulative oxide layers. These gate electrodes are spread out in normal gate electrode pitch sequences over the charge transfer channels, but are arranged in a stack or sandwich structure to squeeze between the adjacent-row photosensors in each intervening column of photosensors 1. The transfer gate electrodes 3 may be integral with gate electrodes of one phase, with transfer being controlled by transfer pulses superposed on normal forward clocking voltages for the CCDs comprising charge transfer channels 2. (If this is done, transfer gate line selector 17 will use tri-state bus drivers and CCD register 14 clocking signals will be supplied from another set of tri-state bus drivers.) Alternatively, transfer gate electrode voltages may be separately bussed to rows of transfer gate electrodes 3 from transfer gate line selector 17.

Transfer gate line selector 17 steps through a cycle of line selection steps at intermittent time intervals time T apart. The time duration of integration in each of the photosensors 1 is essentially T. Transfer gate line selector 17 conditions one of the rows of gate electrodes 3 at a time to allow transfer of charge under them. So photocharge packets collected in the photosensors 1 are selectively transferred by row through charge transfer channels 2 to be collected in respective potential energy wells induced at the ends of those channels 2 under the overlying storage gate electrode 12, then receptive of voltge $V_{SG}$ having its normal relatively positive value. The CSD register 14 charge transfer channels are generally made as narrow as possible and receive CSD register clocking signals of such high rate that charge from the selected row of photosensors 1 usually is transferred by a successive scooping or "charge sweep" process. The collected photocharge from each photosensor is transferred in a single charge packet, if small enough, or in a succession of charge packets, if larger, to be collected and re-integrated to a single charge packet in a potential-energy well induced under storage gate electrode 12.

Each line of charge packets collected in those wells under storage gate electrode 12 is then clocked forward into CCD storage register 10 at a clock rate, which is usually lower than CSD register clocking rate when TDI operation is employed. The CCD storage register 10 is clock rate is the rate at which transfer gate line selector 17 makes its successive line selections. This clock rate forward into CCD storage register 10 is high, however, in comparison to the rate 1/T at which each successive line of charge packets is completely clocked out of output line register 15 to charge sensing stage 16. So the lines of charge transferred out of CSD register 14 into CCD storage register 10 during one of the intermittent cycles of line selection can be considered to be essentially parallel in time.

In the CCD storage register 10 there are extensions of charge transfer channels 2 from charge-sweep-device register 14 to respective charge transfer stages in CCD output line register 15. These extensions of charge transfer channels 2 are parallelled by and spatially interleaved with a further set of charge transfer channels 4. These further charge transfer channels 4 have their output ports arranged to side-load respective ones of the successive charge transfer stages of the CCD output line register 15. The same succession of gate electrodes that crosses the extensions of charge transfer channels 2 into CCD storage register 10 also crosses the charge transfer channels 4, so the charge transfer channels 4 have successive charge transfer stages in rank with successive charge transfer stages in the extensions of charge transfer channels 2. Each charge transfer stage in one of charge transfer channels 4 has a respective transmission gate 5 allowing selective connection between it and a corresponding charge transfer stage in the one of the extensions of charge transfer channels 2 immediately to the right of it in FIG. 1. These selective connections may be surface-channel or buried-channel. The transfer gate electrodes 5 are connected in common bussing to receive a voltage $V_{TG}$, which is normally negative respective to substrate bias potential. So transfer gate electrodes 5 normally have potential energy barriers to charge transfer induced under them. Transfer gate electrodes 5, when pulsed relatively positive compared to their normal negative level, can enable charge transfer from each charge transfer stage in the extensions of charge transfer channels 2 (into CCD storage register 10) to a corresponding charge transfer stage in the one of charge transfer channels 4 immediately to its left in FIG. 1. Construction of transfer gate electrodes 5 is analogous to construction of transfer gate electrodes 3, and their respective operations have similarities.

It may be desirable to provide anti-blooming structure in CCD storage register 10 to prevent blooming that might otherwise arise because of the summed charge packets exceeding the charge storage capacities in CCD register 10. Because of the charge sweep operation of CSD register 14 it is difficult to prevent blooming under all conditions just by using overflow drains with each of the photosensors 1.

In the operation of the FIG. 1 CCD imager it is desired to be able to control the transfer of charge packets by forward clocking independently in the charge transfer channels 4 and in the extensions of charge transfer channels 2 into CCD storage register 10. At the same time it is desired to use continuous gate electrode structures crossing all the charge transfer channels in CCD storage register 10 insofar as possible, to reduce the amount of top-metal bussing the imaging device requires. These desires can be satisfied by making the continuous gate electrode structures in the polysilicon layers that are closer to the semiconductor substrate, which structures receive all except one of the clocking voltage phases. The other phase of clocking voltage for the extensions of charge transfer channels 2 into CCD register 10, which shall be denominated $V_{CLK2}$, and the other phase of clocking voltage for the charge transfer channels 4, which shall be denominated $V_{CLK4}$, are applied to gate electrode structures 25 and 26, respectively (not shown in FIG. 1). Gate electrode structures 25 and 26 either are in a polysilicon layer more remote from the semiconductive substrate or are in top-metallization. The continuous gate electrode structures electrostatically shield portions of the substrate in propinquity to them from the electrostatic induction effects of these gate electrode structures 25 and 26 more remote from the substrate. So, gate electrode structures 25 may extend along the lengths of the extensions of charge transfer channels 2 into CCD storage register 10, but the gate electrode structures 25 will in any case provide the effect of a plurality of gate electrodes crossing these charge transfer channels in cyclic succession with the other gate electrodes. Gate electrode structures 26 may extend along the lengths of charge transfer channels 4 with similar effect.

Figure 2:
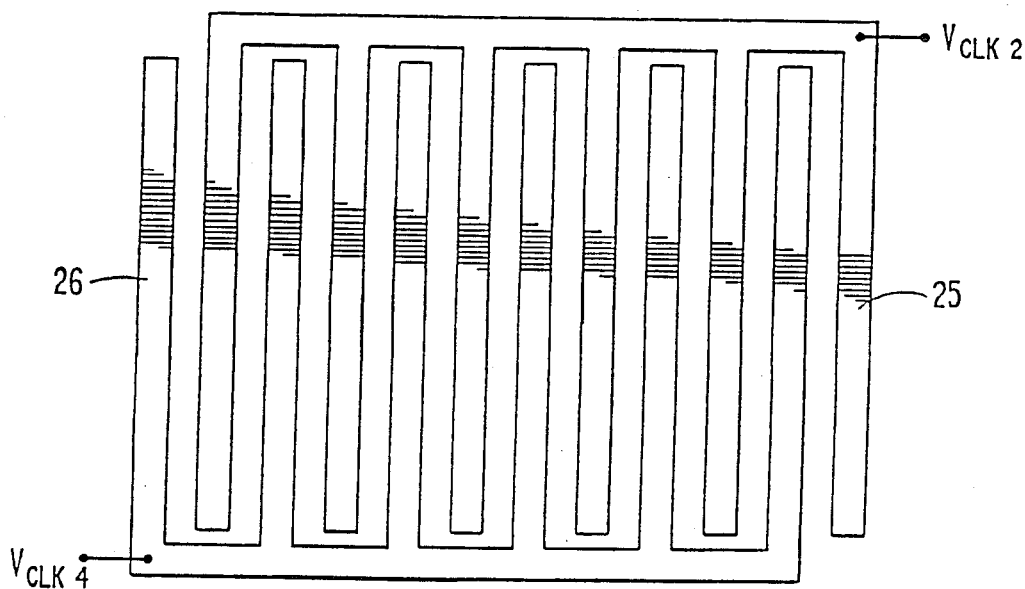
FIG. 2 is a plan view of top-layer gate electrode structures for the FIG. 1 CCD storage register.

FIG. 2 shows how gate electrode structures 25 and 26 may be realized as interdigitated comb structures. The teeth of comb structure 25 extend over the extensions of charge transfer channels 2 into CCD storage register 10. The teeth of comb structure 26 extend over the charge transfer channels 4 in CCD register 10. Top-metal strap connections may be made between the ends (or midpoints) of the teeth to lower gate electrode resistance and improve the time constants for $V_{CLK2}$ and $V_{CLK4}$ reaching more remote portions of the teeth, if necessary.

Figure 3:
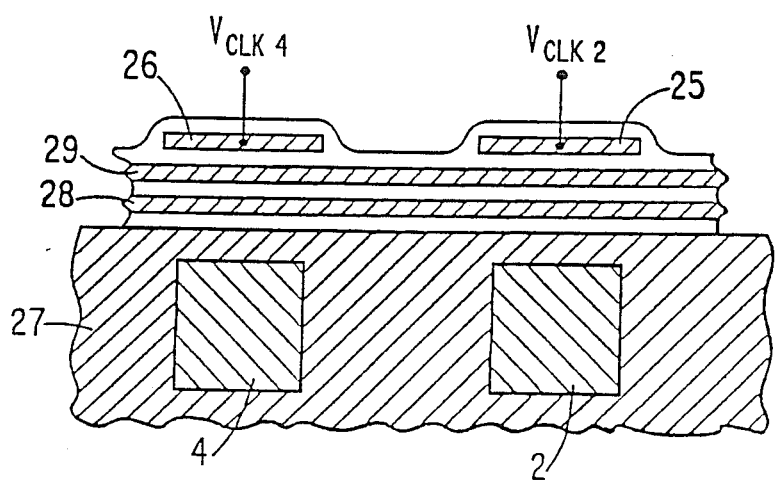
FIG. 3 and FIG. 4 are cross-sectional profile views of portions of the FIG. 1 CCD storage register, in which figures the vertical dimensions (per convention in such views) are in exaggerated scale compared to the horizontal dimensions.

FIG. 3 shows a profile cross-section of a portion of CCD storage register 10. This cross-section cuts through a portion of semiconductive substrate 27 and across an adjacent pair of charge transfer channels 2 and 4. Channel stop structures, not shown, isolate this pair of charge transfer channels from similar other pairs. The regions defining charge transfer channels 2 and 4 can be differentially doped to cause charge transfer to be unidirectional from charge transfer channels 2 to charge transfer channels 4. A three-phase clocked CCD storage register 10 is shown by way of example. One phase of clocking is applied to first-polysilicon-layer gate electrodes 28, isolated from substrate 27 by electric insulative material. Another of the phases is applied to second-polysilicon-layer gate electrodes 29 isolated from substrate 27 and gate electrodes 28 by electrically insulative material. The remaining phase $V_{CLK2}$ of clocking voltage for the extensions of charge transfer channels 2 in CCD storage register 10 is selectively applied to the gate electrode structure 25 extending along the channel lengths and isolated from substrate 27 and gate electrodes 28, 29 by electrically insulative material. The remaining phase $V_{CLK4}$ of clocking voltage for charge transfer channels 4 is selectively applied to the gate electrode structure 26 extending along those channel lengths and isolated from substrate 27 and gate electrodes 28, 29 by electrically insulative material.

Figure 4:
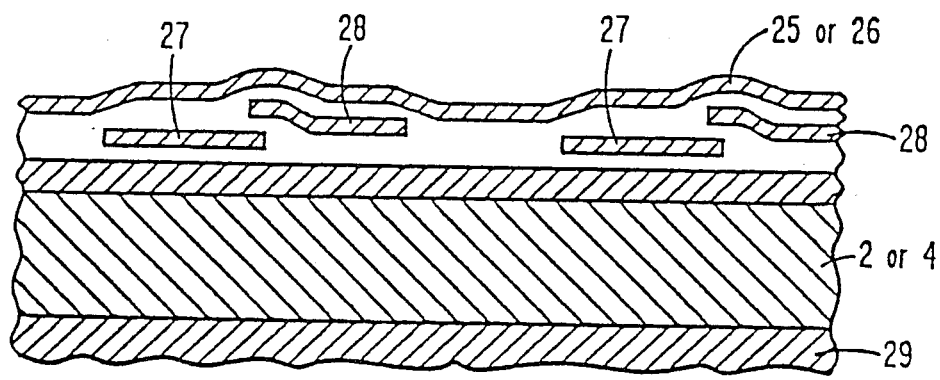

FIG. 4 shows a cross-section profile cutting through the middle of one of charge transfer channels 2 or 4.

Figure 5:
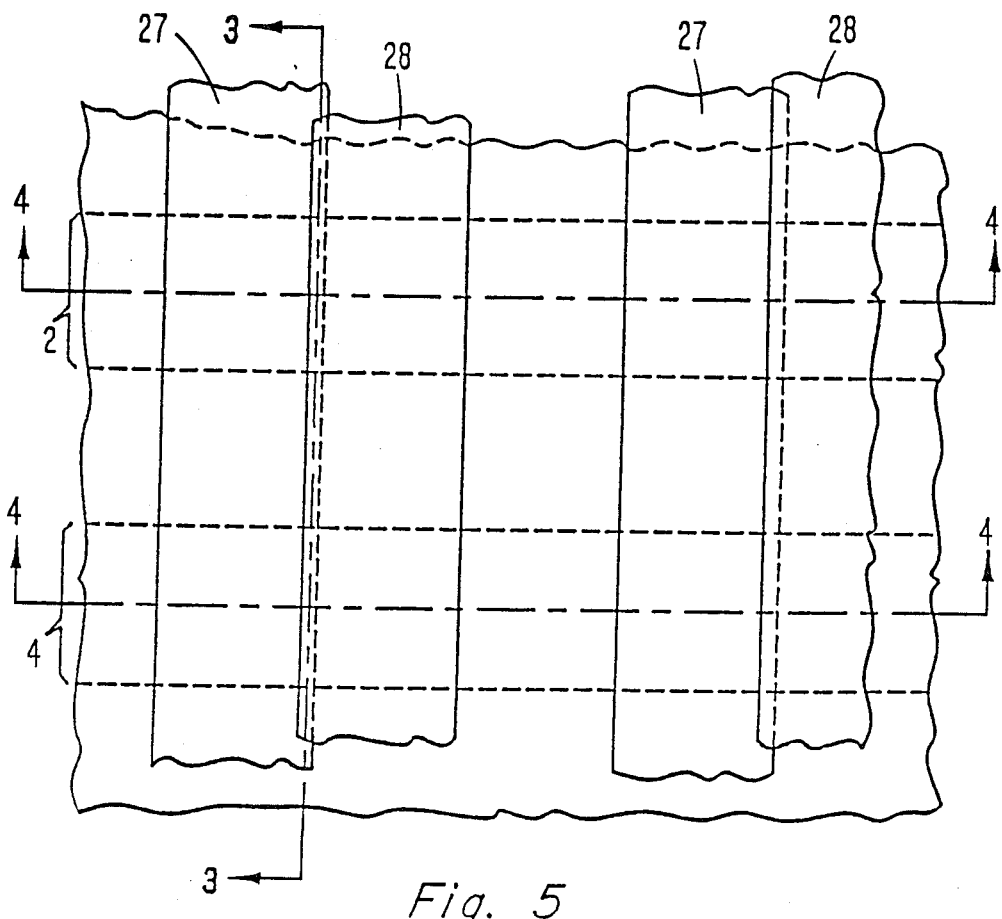
FIG. 5 is a plan view of a portion of the FIG. 1 CCD register, with top-layer gate electrode structures omitted to avoid confusion in interpreting the drawing.

FIG. 5 shows a plan view of an adjacent pair of charge transfer channels 2 and 4 in a portion of CCD storage register 10, on which the location of the FIG. 3 cross-sectional profile is indicated. Alternate locations of the FIG. 4 cross-sectional profile are also indicated.

More complex structures for constructing CCD storage register 10 can be envisioned by the skilled CCD designer, particularly if the number of clocking voltage phases is allowed to exceed three. Certain of these structures reduce the number of polysilicon layers in which the gate electrodes are defined. Certain of these structures remove the need for differentially doping the charge transfer channels 2 and 4 to determine direction of charge transfer, providing for that directionality by electrostatic induction from more complex gate electrode structures. Indeed, gate electrode structures which allow charge transfer between corresponding charge transfer stages in adjacent charge transfer channels 2 and 4 in either of the two possible directions, by simply changing clocking voltage phasing sequences are available.

Refer to the timing diagrams of FIGS. 6A-C to understand how time-delay-integration can be carried out in a first direction in the FIG. 1 imager, The timing diagrams in this specification concern operation of one extended charge transfer channel 2, the charge transfer channel 4 immediately to its left in FIG. 1, and the associated photosensors. The eight-row registers of FIG. 1 would require timing diagrams of such complexity as to be difficult to draw and to understand, so four-row registers of a simpler imager will be considered in the timing diagrams. However, for convenience, the parts corresponding to those of the FIG. 1 imager will continue to be referred by the same identification numbers used in FIG. 1. In FIGS. 6A–C the boxes 51, 52, 52, 54 represent a column of photosensors in the CSD register 14.

The boxes representative of the charge transfer stages in the CSD register to which the photosensors 51–54 transfer charge are numbered 66–69, and the charge transfer stage under storage gate electrode 12 and storage-control gate electrode 13 is represented by box 65. The boxes 61–64 represent charge transfer stages in the extensions of the CSD register charge transfer channels 2, those which extend into the CCD storage register 10; and boxes 71–74 represent the charge transfer stages in the adjacent charge transfer channel 4 selectively connected by transmission gates 5 to the charge transfer stages 61–64, respectively.

Operation will be described with respect to the representative column structure of the FIG. 1 imager. Such operation parallels, in time, similar operations in the other column structures of the FIG. 1 imager.

At time $t_0$ in FIG. 6A the samples $S_{01}$, $S_{02}$, $S_{03}$ and $S_{04}$ descriptive of a column of image elements, have accumulated as charge packets over a preceding image integration interval of duration T. In denominating individual charge packets that are samples of image elements, the letter S followed by a two-digit subscript will be used. The first digit of the subscript indicates the ordinal number of the respective integration interval of length T, which intervals are consecutively numbered. The second digit of the subscript is the same as the last digit of the identification numeral of the one of the photosensors 51, 52, 53 or 54 in which the charge packet was originally accumulated. The times $t_1$, $t_2$, and $t_3$ follow time $t_0$ in close succession at intervals substantially shorter than T.

Between times $t_0$ and $t_1$, CSD operation takes place in the CSD register 14 of which photosensors 51, 52, 53 and 54 are a part. The CSD operation is as follows. The transmission gates 3 connecting the first row of photosensors (of which 51 is one) are rendered transmissive, and charge packets from the first row of photosensors 1 are swept out into the charge transfer channels 2 to accumulate as a first line of charge packets under the storage gate electrode 12 at the end of the CSD register (i.e. to be stored in charge transfer stage 65 and its counterparts). Then, after appropriate pulsing of the storage gate electrode 12 and its following storage control gate electrode 13, this first line of charge packets is clocked forward into the CCD storage register 10, to its fourth row including charge transfer stage 64. The transmission gates 3 connecting the second row of photosensors (of which 52 is one) are then rendered transmissive, and charge packets from the second row of photosensors 1 are swept out into the charge transfer channels 2 to accumulate as a second line of charge packets under the storage gate electrode 12. Then, this second line of charge packets is clocked forward into the CCD storage register 10, to its fourth row including charge transfer stage 64. Simultaneously, the charge packets originating in the first row of photosensors 1 are clocked forward into the third row of CCD storage register 10 including charge transfer stage 63. The transmission gates 3 connecting the third row of photosensors (of which 53 is one) are then rendered transmissive, and charge packets from the third row of photosensors 1 are swept out into the charge transfer channels 2 to accumulate as a third line of charge packets under the storage gate electrode 12. Then, this third line of charge packets is clocked forward into the CCD storage register 10, to its fourth row including charge transfer stage 64. Simultaneously, the charge packets previously in the fourth and third rows of CCD storage register 10 are transferred to positions in its third and second rows, respectively. The transmission gates 3 connecting the fourth row of photosensors (of which 54 is one) are then rendered transmissive, and charge packets from the fourth row of photosensors 1 are swept out into the charge transfer channels to accumulate as a fourth line of charge packets under the storage gate electrode 12. Then, this fourth line of charge packets is clocked forward into the CCD storage register 10, to its fourth row including charge transfer stage 64. Simultaneously, the charge packets originating in the third, second, and first rows of photosensors are transferred to positions in the third, second, and first rows of CCD storage register 10. These CSD operations take place in a relatively short period of time so the samples with the same first digit in their subscript are, practically speaking, obtained contemporaneously. At time $t_0$ the charge packets $S_{01}$, $S_{02}$, $S_{03}$, and $S_{04}$ repose in charge transfer stages 61, 62, 63, and 64 respectively.

Between times $t_1$ and $t_2$, the charge packet contents of charge transfer stages 61, 62, 63 and 64 in a charge transfer channel 2 extension are shifted into the corresponding charge transfer stages 71, 72, 73 and 74 of the adjacent charge transfer channel 4. In this instance there are presumed not to be previously stored charge packets in charge 71, 72, 73, 74 (as might be the case after a cap-up of the camera when image radiation is not permitted to reach the imager). Where there are previously stored charge packets, the newly admitted charge packets will merge with them to perform a set of sample addition steps parallel-in-time. This shift operation is carried out by pulsing the voltage $V_{TG}$ applied to the transmission gate electrodes 5 relatively positive compared to normal condition, to lower the potential energy barriers to charge transfer that are normally induced under the gate electrodes 5.

After time $t_2$ the storage register 10 is forward clocked one cycle to advance by one charge transfer stage each of the charge packets in the charge transfer channels 4 (and each of the null charge packets in the extensions of charge transfer channels 2 as well). In FIG. 6A this clocks $S_{01}$ charge packet out of storage register 10 (to side-load one of the charge transfer stages of output line register 15); and it advances the $S_{02}$, $S_{03}$, and $S_{04}$ charge packets to charge transfer stages 71, 72 and 73, respectively, giving rise to the conditions shown for time $t_3$.

Over an ensuing time interval of duration T a new set of charge packets $S_{11}$, $S_{12}$, $S_{13}$, and $S_{14}$ are accumulated in photosensors 51, 52, 53, and 54, respectively. The same set of charge packets sampling image operations described with respect to $S_{01}$, $S_{02}$, $S_{03}$, and $S_{04}$ elements as taking place between each of the successive times $t_0$, $t_1$, $t_2$ and $t_3$ are repeated with respect to $S_{11}$, $S_{12}$, $S_{13}$, and $S_{14}$ charge packets between each of the successive times $T+t_0$, $T+t_1$, $T+t_2$ and $T+t_3$. These operations are repeated at intervals T later for each successive set of charge packets sampling image elements.

In modulo-T time, then, these cyclically recurrent steps are as follows:

at time $t_0$ to $t_1$, charge sweep and forward clock operations are used to move charge packets descriptive of image samples into CCD storage register 10 charge transfer channel 2 extensions;

between times $t_1$ and $t_2$, charge packets sampling image are shifted from charge transfer stages in the extension of charge transfer channels 2 to corresponding charge transfer stages in charge transfer channels 4;

between times $t_2$ and $t_3$, each charge packet in charge transfer channel 4 is advanced one charge transfer stage, with charge packets transferred from the output ports of charge transfer channels 4 side-loading respective charge transfer stages in output line register 15; and between times $t_3$ and $T+t_0$, charge packets descriptive of a new-line of image samples accumulate in photosensors 1 (including 51-54), while output line line register 15 is forward clocked at pixel-scan rate to operate as a shift register for serially supplying to charge sensing stage 16 charge packets descriptive of the previous line of image samples.

With reference to FIG. 6C, the time-delay-integration results of these repeated operations begins to become evident at time $3T+t_2$. Between times $3T+t_2$ and $3T+t_3$, the charge packet shifted out of charge transfer stage 61 into the output line register 15 will equal $S_{04}+S_{13}+S_{22}+S_{31}$. Between times $4T+t_2$ and $4T+t_3$, the charge packet shifted out of charge transfer stage 61 will equal $S_{14}+S_{23}+S_{32}+S_{41}$. The charge packets shifted out of storage register 10 are progressively later in time as a function of lower row position in CSD register 14. This compensates for an upward motion of the imager platform relative to imager field of view, which motion is at a rate of one row per time interval T.

Figure 7C:
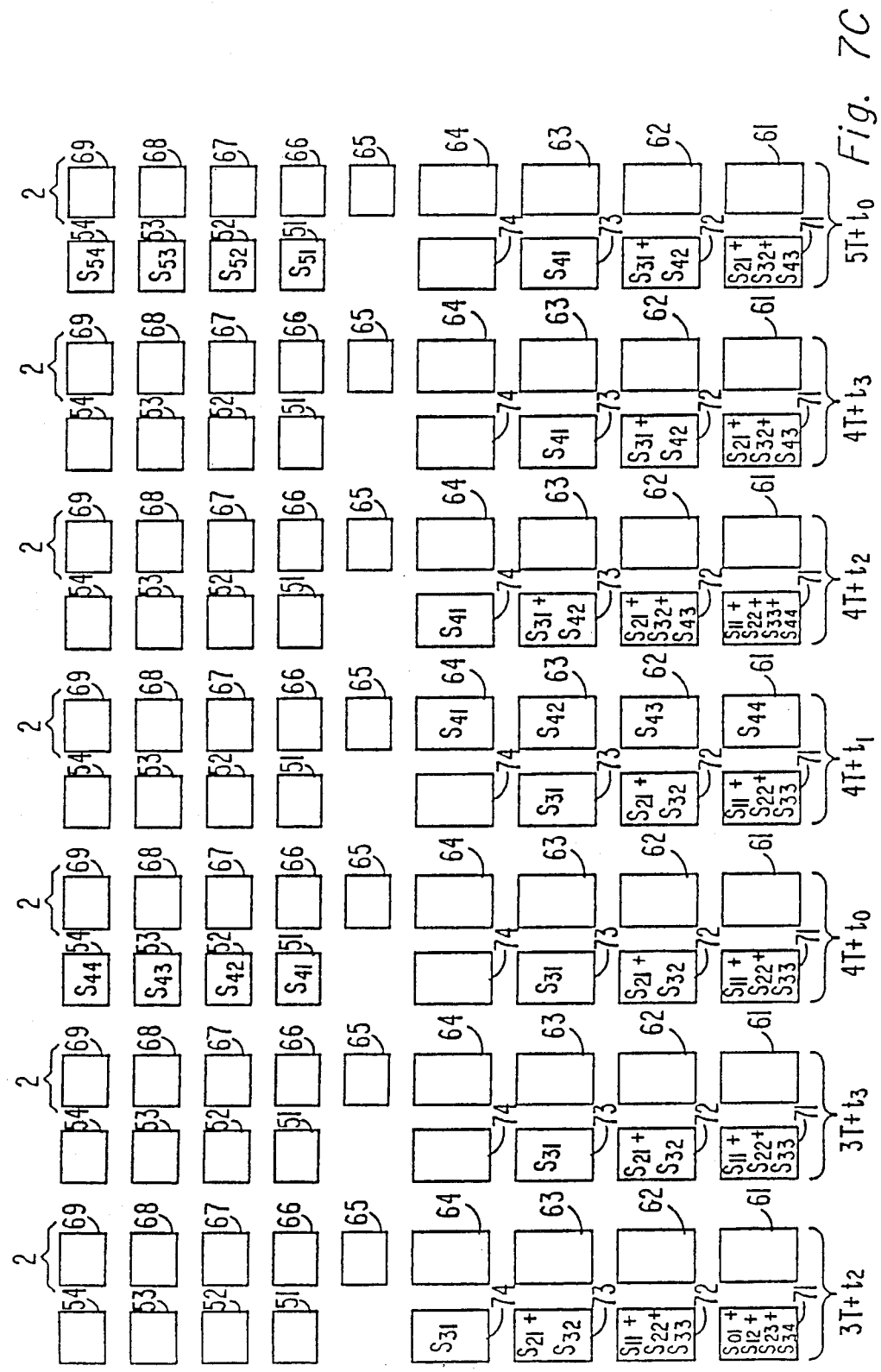

FIGS. 7A-C are referred to to understand how time-delay-integration is carried out in the FIG. 1 imager when it is desired to compensate for a downward motion of the imager platform relative to imager field of view, which motion is at a rate of one row per time interval T. Operation differs from that illustrated by FIGS. 6A-C in the CSD operation used to transfer charge packets descriptive of a column of image elements from the photosensors 1 into the CCD storage register 10 between the times $t_0$ and $t_1$ in modulo-T time.

This alternative mode of CSD operation is as follows. The transmission gates 3 connecting the fourth row of photosensors (of which 54 is one) are rendered transmissive, and charge packets from the fourth row of photosensors 1 are swept out into the charge transfer channels 2 to accumulate as a first line of charge packets under the storage gate electrode 12 at the end of the CSD register (i.e. in charge transfer stage 65 and its counterparts). Then, after appropriate pulsing of the storage gate electrode 12 and its following storage control gate electrode 13, this first line of charge packets is clocked forward into the CCD storage register 10, to its fourth row including charge transfer stage 64. The transmission gates 3 connecting the third row of photosensors (of which 53 is one) are then rendered transmissive, and charge packets from the third row of photosensors 1 are swept out into the charge transfer channels 2 to accumulate as a second line of charge packets under the storage gate electrode 12. Then, this second line of charge packets is clocked forward into the CCD storage register 10, to its fourth row including charge transfer stage 64. Simultaneously, the charge packets originating in the fourth row of photosensors 1 are clocked forward into the third row of CCD storage register 10 including charge transfer stage 63. The transmission gates 3 connecting the second row of photosensors (of which 52 is one) are then rendered transmissive, and charge packets from the second row of photosensors 1 are swept out into the charge transfer channels 2 to accumulate as a third line of charge packets under the storage gate electrode 12. Then, this third line of charge packets is clocked forward into the CCD storage register 10, to its fourth row including charge transfer stage 64. Simultaneously, the charge packets previously in the fourth and third rows of CCD storage register 10 are transferred to positions in its third and second rows, respectively. The transmission gates 3 connecting the first row of photosensors (of which 51 is one) are then rendered transmissive, and charge packets from the first row of photosensors 1 are swept out into the charge transfer channels to accumulate as a fourth line of charge packets under the storage gate electrode 12. Then, this fourth line of charge packets is clocked forward into the CCD storage register 10, to its fourth row including charge transfer stage 64. Simultaneously, the charge packets originating in the second, third and fourth rows of photosensors are transferred to positions in the third, second, and first rows of CCD storage register 10. These CSD operations take place in a relatively short period of time so the samples with the same first digit in their subscript are, practically speaking, obtained contemporaneously. At time $t_1$ the charge packets $S_{01}$, $S_{02}$, $S_{03}$, and $S_{04}$ repose in charge transfer stages 64, 63, 62, and 61 respectively.

Figure 8:
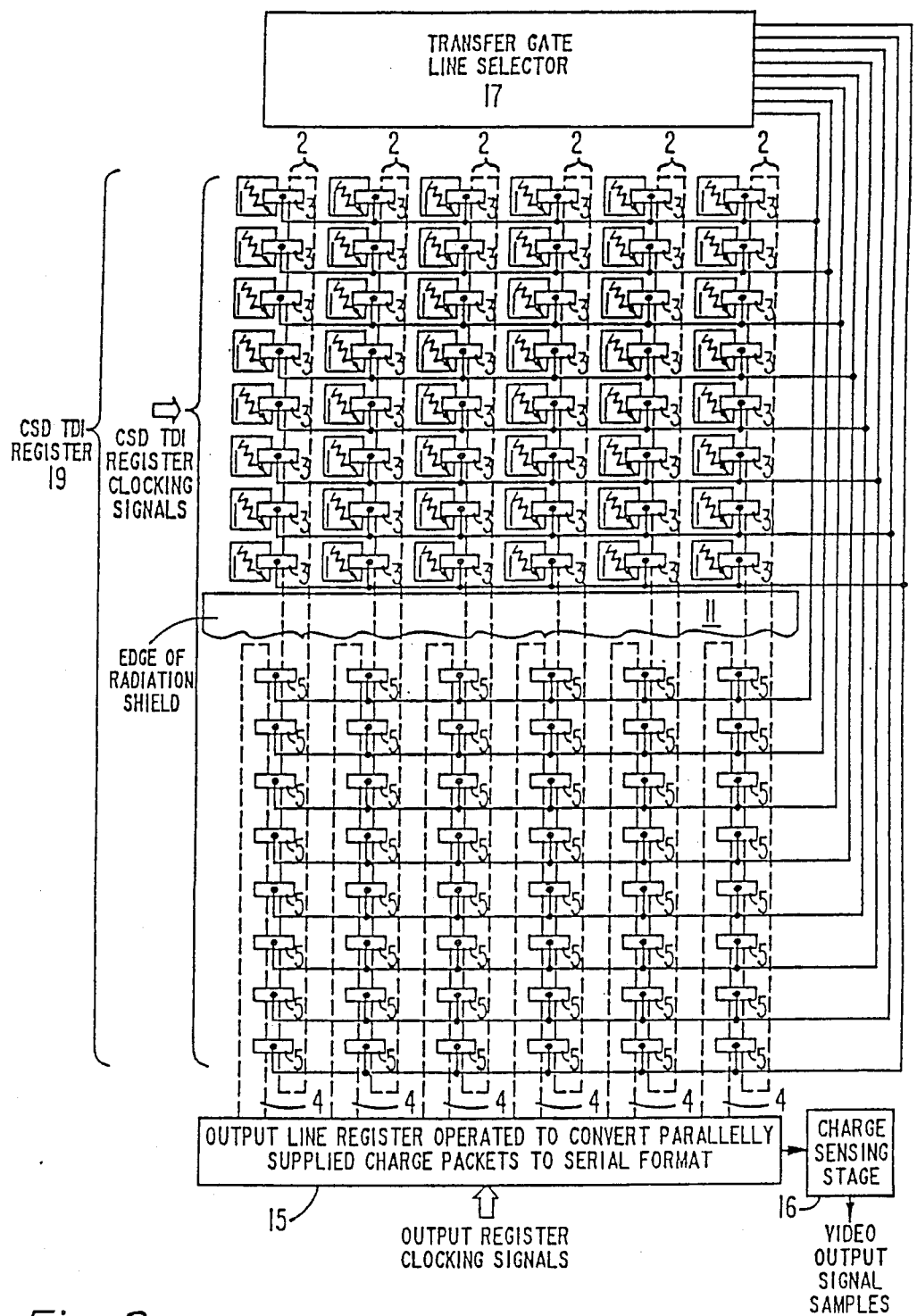
FIG. 8 is a block schematic of another infrared line imager using charge sweep processing as described in U.S. patent application Ser. No. 022,587 which can be used in the present invention, embodying the invention. The charge sweep process involves the CCD storage register as well as the transfer register in the photosensing area of the imager.
Figure 9D:
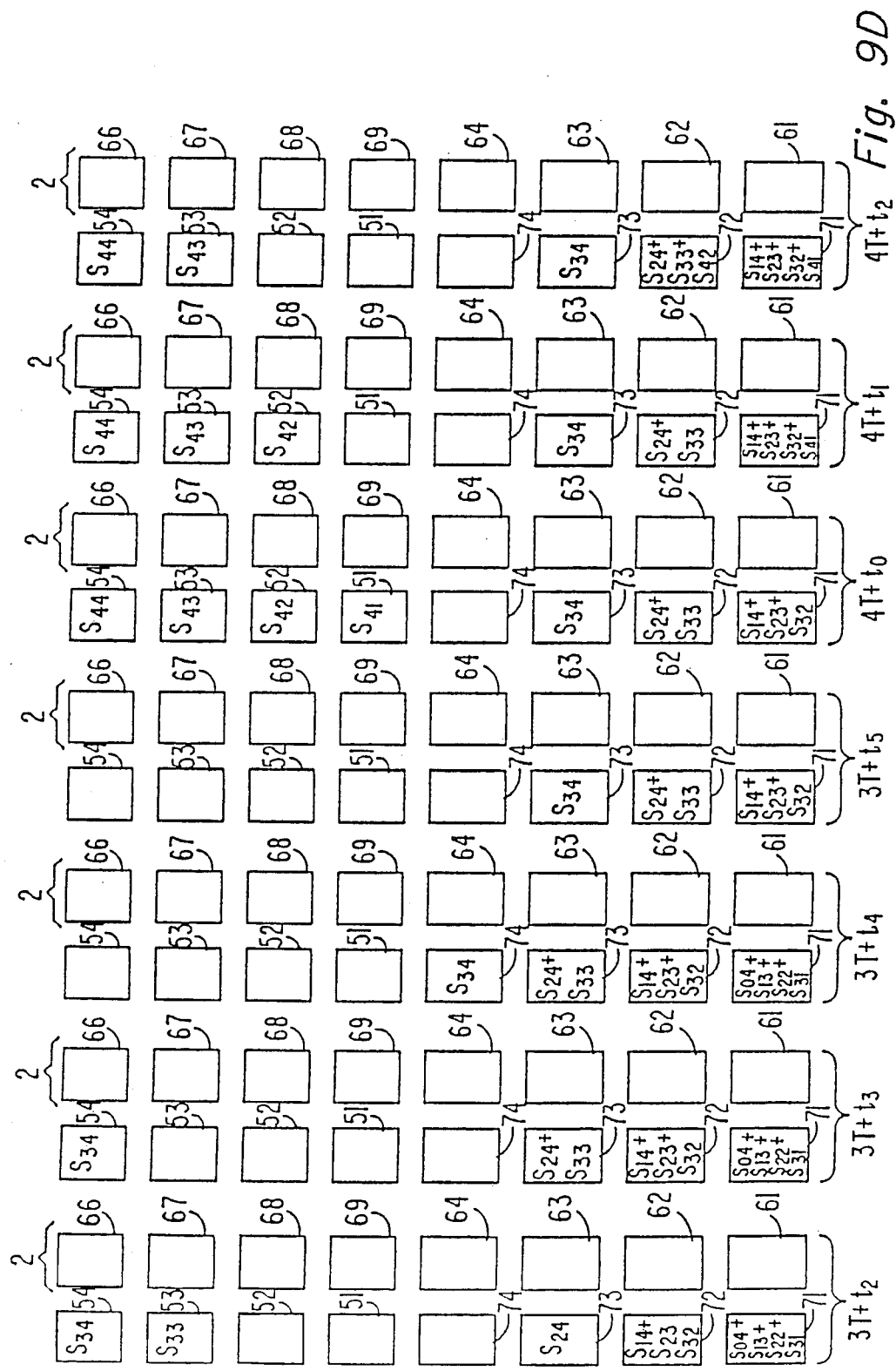

FIG. 8 shows a modification of the FIG. 1 imager in which charge-sweep-device operation is extended into the CCD storage register 10 of FIG. 1. That is, registers 14 and 10 merge into one charge-sweep-device time-delay-integration register 19. The charge transfer stages in the charge transfer channels 4 provide the collecting wells for CSD operation in FIG. 7, so storage gate electrode 12, storage control gate electrode 13 and the widening of charge transfer channels 2 to accommodate charge storage under gate electrode 12 are dispensed with. The transfer gate line selector 17 controls each successive row of transfer gates 3 in parallel with each successive row of transfer gates 5 in the CSD TDI register 19, so there is no need for a separate transfer gate line selector for the transfer gates 5. (Since there is no need to photoconvert impinging radiation in charge transfer channels 4, one may make the transfer gates 5 continuous structures crossing over the charge transfer channels 4 and the extensions of charge transfer channels 2 into register 19 rather than discrete transfer gates 5 as shown in FIG. 8.)

FIGS. 9A-D are a timing diagram for a simplified FIG. 8 imager. The operation carried out recurrently at intervals T is as follows, in module-T time.

A charge sweep operation takes place between times $t_0$ and $t_4$, during which time forward clocking is halted in charge transfer channels 4. Between times $t_0$ and $t_1$ the transmission gates 5 connecting the first row of charge transfer stages in register 19 charge transfer channel 2 extensions, including 61, to corresponding charge transfer stages in charge transfer channels 4, including 71, are pulsed to lower the potential energy barriers to charge transfer otherwise induced thereunder. Charge sweep is from photosensor 51 all the way to charge charge transfer stage 71.

The accumulated photocharge is then swept from the other rows of photosensors 1 to fill corresponding rows of charge transfer stages in the charge transfer channels 4, in an analogous manner to the way charge packets were swept from the first row of photosensor 1. Between times $t_1$ and $t_2$ charge sweep operation of register 19 removes accumulated photocharge from photosensor 52 to charge transfer stage 72. Between times $t_2$ and $t_3$ charge sweep operation of register 19 removes accumulated photocharge from photosensor 53 to charge transfer stage 73. Between times $t_3$ and $t_4$ charge sweep operation of register 19 removes accumulated photocharge from photosensor 54 to charge transfer stage 74. The charge packets swept into charge transfer stages 71–74 merge with any charge packets previously stored therein.

Between times $t_4$ and $t_5$ the charge packets in charge transfer channels 4 are advanced one stage. $S_{04}$ is transferred from charge transfer stage 74 to the succeeding stage 73; $S_{03}$ is transferred from stage 73 to the succeeding stage 72; and $S_{02}$ is transferred from stage 72 to the succeeding stage 71. The line of Charge packets (including $S_{01}$) transferred out of register 19 side-loads the output line register 15.

The FIG. 8 imager can be operated to provide the opposite direction of TDI operation sweeping change from rows of photosensors 1 to fill respective rows of charge transfer stages in opposite ordering in FIG. 8. So both the FIG. 1 imager and the FIG. 8 imager have the advantage that TDI operation in either direction transverse to the rows of photosensors 1 can be arranged.

Another of the advantages of the FIG. 1 and FIG. 8 imagers is that one may select an operating mode from amongst a range of different TDI modes and a staring mode by making simple changes in the programming of the clocking voltages in their area array registers (10 and 14 in FIG. 1 imager, 19 in FIG. 8 imager). That is, one, two or four of the photosensors 1 in each column can be associated with a respective pixel, rather than each column of eight photosensors 1 being included in a single pixel. Accordingly, the FIG. 1 and FIG. 8 imagers can be operated to accommodate variation in the average intensity of imager illumination. This accommodation can be taken advantage of using operator-control or automatic-control systems.

Other variants of the FIG. 1 imager are possible, of course. The intermediate line storage register which storage and storage-control gate electrodes 12, 13 provide for may be replaced by an intermediate storage register capable of storing a few successive lines of charge packets, for example.

The CCD imagers thus far described in connection with FIGS. 1–9 and CCD imagers described in connection with FIGS. 1–7 of U.S. patent application Ser. No. 938,863 permit TDI operation irrespective of which direction of relative transverse motion between imager and objects being imaged obtains. These types of imager are suited for use in the present invention.

Figure 10:
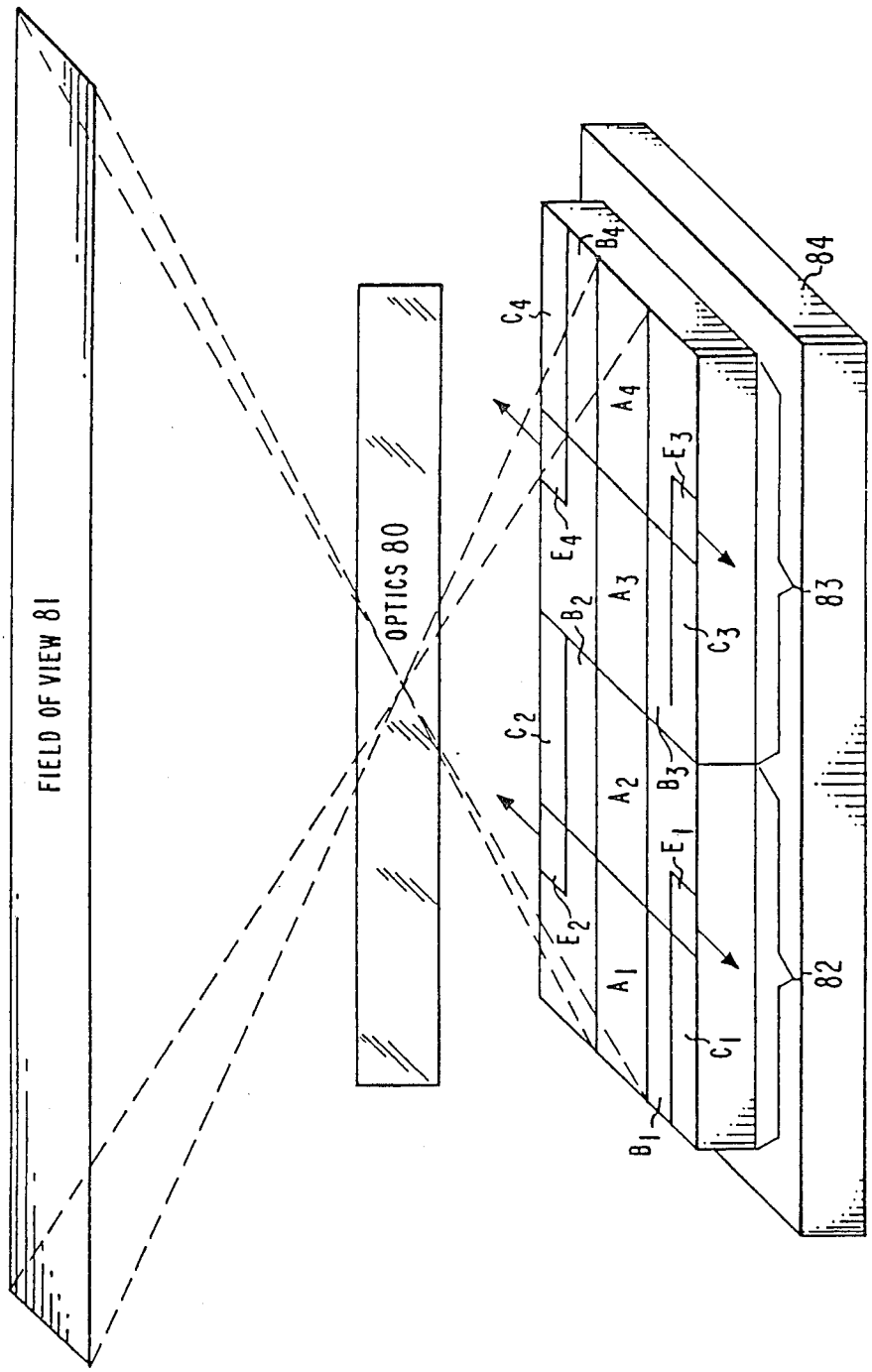
FIG. 10 is a schematic diagram of a camera constructed from monolithically integrated component line imagers in accordance with an aspect of the present invention, showing how the component images lay out on a die of semiconductor material.

FIG. 10 infrared camera embodying the invention has optics 80 for projecting a field of view 81 in aliquot portions onto four image registers $A_1$, $A_2$, $A_3$ and $A_4$. Image register $A_1$, a field storage register $B_1$, a parallel-to-serial-converting line register $C_1$ and an electrometer $E_1$ comprise a first imager integrated on a semiconductor die 82 together with a second imager comprising image register $A_2$, a field storage register $B_2$, a parallel-to-serial line register $C_2$ and an electrometer $E_2$. The image registers $A_1$ and $A_2$ are in side-by-side alignment with each other on die 82, with the first and second imagers disposed in 180° rotated geometric relationship with each other, and with sides of image registers $A_1$ and $A_2$ at die 82 edges. Image register $A_3$, a field storage register $B_3$, a parallel-to-serial-converting line register $C_3$ and an electrometer $E_3$ comprise a third imager integrated on a semiconductor die 83 together with a fourth imager comprising image register $A_4$, a field storage register $B_4$, a parallel-to-serial-converting line register $C_4$ and an electrometer $E_4$. The image registers $A_3$ and $A_4$ are in side-by-side alignment with each other on die 83, with the third and fourth imagers disposed in 180° rotated geometric relationship with each other, and with sides of image registers $A_3$ and $A_4$ at die 83 edges. Dies 82 and 83 are mounted in abutted relationship on a base plate 84 such that the abutting image registers $A_2$ and $A_3$ are in side-by-side alignment. To maintain the closely abutted relationship of image registers $A_2$ and $A_3$ over a range of operating temperatures it is advantageous to make base plate 84 of the same basic material as semiconductor dies 82 and 83. Presuming this basic material is silicon, base plate 84 may be amorphous silicon, and the dies 82 and 83, single-crystalline silicon. Having the electrometers $E_1$ and $E_2$ well inboard on die 82, and having the electrometers $E_3$ and $E_4$ well inboard on die 83, facilitates the close abutting of image registers $A_2$ and $A_3$ since edges of dies 82 and 83 may be at sides of image registers $A_2$ and $A_3$.

All four imagers in the FIG. 10 camera are operated TDI. But in accordance with the invention the relative direction of TDI operation relative to the imager itself differs as between the odd-numbered imagers and the even-numbered images. That is, TDI is the same as between $A_1$ and $B_1$ registers and as between $A_3$ and $B_3$ registers, and TDI is the same as between $A_2$ and $B_2$ registers and as between $A_4$ and $B_4$ registers. Because of the 180° rotated relationship between the first and second imagers, TDI is in the same direction for them in the absolute sense, though opposite in directions relative to the imagers themselves. Because of the 180° rotated relationship between the third and fourth imagers, TDI is in the same direction for them in the absolute sense, though opposite in directions relative to the imagers themselves. So in the absolute sense TDI operation is the same in all four imagers despite them not all being disposed the same way on the adjoining dies 82 and 83.

As shown, FIG. 10 camera uses imagers of front-illuminated type. To avoid needing transparent electrodes, imagers 1 and 2 may instead be CCD imagers of the back-illuminated type. In these, radiant energy enters the CCD imager through the surface of the semiconductor die opposite its surface on which the gate electrodes of the charge transfer devices are disposed. Silicon semiconductor dies on which back-illuminated CCD imagers are constructed are thinned to facilitate the penetration of radiation, and then are mounted on a glass plate transparent to the visible and near infrared (NIR) spectrum.

Variants of the FIG. 10 camera which use only two or three component imagers on a single semiconductor die are possible. The invention is also useful in contexts where the 180° rotations of component imagers are done for purposes other than facilitating butted arrays of several imager-bearing dies.

Figure 11:
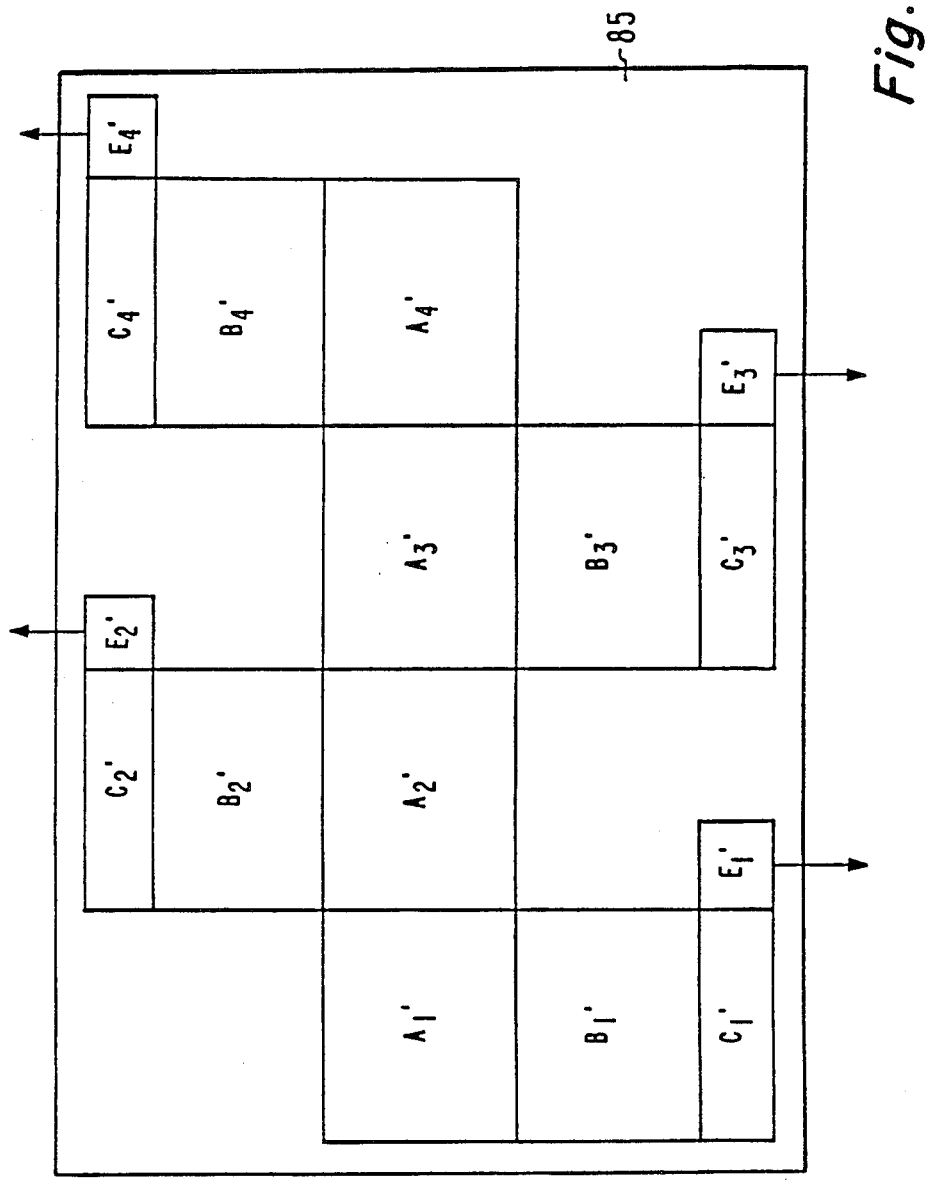
FIG. 11 is a plan view of an alternative way component imagers lay out on a die of semiconductive material in accordance with a further aspect of the present invention.

FIG. 11 shows the layout of an imager-bearing die of semiconductor material having a rectangular edge boundary 85, which can be operated in a camera in accordance with the invention, replacing dies 82 and 83 in base plate 84 in the FIG. 10 camera. Four component imagers are used to reduce the number of charge transfer stages in each of parallel-to-serial converting line registers $C_1'$, $C_2'$, $C_3'$ and $C_4'$. This saves substantial clocking power in a high-resolution imager, since these line registers may be clocked out in parallel at one quarter the clock rate required were they serially polled. The electrometers $E_1'$, $E_2'$, $E_3'$, and $E_4'$ are arranged at the ends of line registers $C_1'$, $C_2'$, $C_3'$ and $C_4'$ that permit the time sequence of samples to map imager space in the same direction. The first imager comprising image register $A_1'$ and field storage register $B_1'$ (as well as line register $C_1'$ and electrometer $E_1'$) and the third imager comprising image register $A_3'$ and field storage register $B_3'$ (as well as line register $C_1'$ and electrometer $E_1'$) are essentially the same in structure. The second imager comprising image register $A_2'$ and field storage register $B_2'$ (as well as line register $C_2'$ and electrometer $E_2'$) and the fourth imager comprising image register $A_4'$ and field storage register $B_4'$ (as well as line register $C_4'$ and electrometer $E_4'$) are essentially the same in structure. TDI operation of the first and third imagers is the same. TDI operation of the second and fourth imagers is the same. These two sets of TDI operations are opposite from each other, however, so as to provide similar directions of TDI operation in the absolute sense.

What is claimed is:

1. A semiconductor imager comprising:

a semiconductor die having opposed first and second major surfaces, said first and second major surfaces having respective similar first dimensions between first and second boundaries and having respective similar second dimensions between third and fourth boundaries, said first and second dimensions being measured in respective first and second directions perpendicular to each other;

a plurality of image registers for receiving radiant energy image, consecutively ordinally numbered first through $n^{th}$ and disposed side by side on the first major surface of said semiconductor die, each of said image registers having a respective width extending in said first direction, having a first end and having a second end opposed to its first end, said second end for transmitting rows of charge packets therefrom, the first end of each odd-numbered said image register and the second end of each even-numbered said image register being in alignment with each other, and the second end of each odd-numbered said image register and the first end of each even-numbered said image register being in alignment with each other;

a plurality of parallel to serial converters for charge packets, said converters being consecutively ordinally numbered first through $n^{th}$ and having respective output ports;

a plurality of charge-coupled-device field storage registers consecutively ordinally numbered first through $n^{th}$, each of said field storage registers having a first end for receiving rows of charge packets from the second end of the correspondingly numbered image register and having a second end for transmitting rows of charge packets therefrom to the correspondingly numbered parallel to serial converter;

means for operating each of said image registers and its correspondingly numbered field storage register to provide TDI operation in the same direction respective to said semiconductor die; and means, responsive to charge packets delivered serially from the output ports of said plurality of parallel to serial converters, for generating an output signal for said semiconductor imager.

2. A semiconductive imager as set forth in claim 1, wherein said first image register and said first field storage register abut said first boundary and wherein said $n^{th}$ image register and said $n^{th}$ field storage register abut said second boundary.

3. A semiconductor imager as set forth in claim 2 wherein said first parallel to serial converter is a first charge-coupled-device line register disposed proximate to the second end of said first field storage register, sideloaded from the second end of said first field storage register, and arranged with its output port at the end of said first line register remote from said first boundary; and wherein said $n^{th}$ parallel to serial converter is a further charge-coupled-device line register disposed proximate to the second end of said second field storage register, and arranged with its output port at the end of said further line register remote from said second boundary.

4. A semiconductor imager as set forth in claim 3 wherein said means for generating an output signal for said semiconductor imager comprises:

a first electrometer, responsive to charge packets from the output port of said first line register, for generating a first portion of said output signal; and a further electrometer, responsive to charge packets from the output port of said further line register, for generating a further portion of said output signal.

5. A plurality of semiconductor imagers as set forth in claim 3 arranged in buttable array.

6. A plurality of semiconductor imagers arranged in buttable array as set forth in claim 5 included in a camera together with:

optics for imaging a field of view on the n image registers in said array of semconductor imagers.

7. A plurality of semiconductor imagers arranged in buttable array as set forth in claim 5 wherein n is two in each said semiconductor imager; $n^{th}$ is second, and further is second.

8. A semiconductor imager as set forth in claim 3 wherein n is two, $n^{th}$ is second, and further is second.

9. A semiconductor imager as set forth in claim 8 included in a camera together with:

optics for imaging a field of view on the first and second image registers of said semiconductor imager.

10. A semiconductor imager as set forth in claim 1 included in a camera together with:

optics for imaging a field of view on the image registers of said semiconductor imager.

* * * * *